United States Patent
Yamada

(10) Patent No.: US 9,638,745 B2
(45) Date of Patent: May 2, 2017

(54) WAFER MOUNTING METHOD AND WAFER INSPECTION DEVICE

(71) Applicant: Tokyo Electron Limited, Tokyo (JP)

(72) Inventor: Hiroshi Yamada, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 40 days.

(21) Appl. No.: 14/431,365

(22) PCT Filed: Aug. 30, 2013

(86) PCT No.: PCT/JP2013/074003
§ 371 (c)(1),
(2) Date: Mar. 26, 2015

(87) PCT Pub. No.: WO2014/054377
PCT Pub. Date: Apr. 10, 2014

(65) Prior Publication Data
US 2015/0260788 A1  Sep. 17, 2015

(30) Foreign Application Priority Data

Oct. 3, 2012 (JP) .................................. 2012-221256

(51) Int. Cl.
*G01R 31/28* (2006.01)
*G01R 1/073* (2006.01)
(Continued)

(52) U.S. Cl.
CPC ....... *G01R 31/2887* (2013.01); *G01R 1/0408* (2013.01); *G01R 1/07364* (2013.01);
(Continued)

(58) Field of Classification Search
CPC .............. G01R 31/2893; G01R 1/0408; G01R 31/2887; G01R 1/07364; H01L 21/687; H01L 21/68
See application file for complete search history.

(56) References Cited

U.S. PATENT DOCUMENTS 6,380,755 B1* 4/2002 Sato ................ G01R 31/31727
324/754.07
2005/0253575 A1* 11/2005 Takekoshi ............ G01R 1/0433
324/750.03
(Continued)

FOREIGN PATENT DOCUMENTS

JP       2001-338952 A    12/2001
JP       2002-076073 A     3/2002
(Continued)

OTHER PUBLICATIONS

JP 2009099630 A—English translation.*
International Search Report issued on Nov. 19, 2013 for WO 2014/054377 A1.

*Primary Examiner* — Melissa Koval
*Assistant Examiner* — Haidong Zhang
(74) *Attorney, Agent, or Firm* — Abelman, Frayne & Schwab

(57) ABSTRACT

Disclosed is a method for mounting a wafer on a probe card. In the wafer mounting method, an extendable tubular member is placed to surround the probe card, the wafer is placed on a chuck top, the chuck top is supported by a movable stage, and the stage is moved toward the probe card together with the wafer and the chuck top to bring the chuck top into contact with the tubular member. After the chuck top is in contact with the tubular member, the stage is moved toward the probe card together with the wafer and the chuck top to bring the wafer into contact with the probe card and maintain a positional relationship of the stage, the wafer, and the chuck top. After the wafer is in contact with the probe card, a space surrounded by the chuck top, the tubular member, and the probe card is evacuated.

7 Claims, 8 Drawing Sheets

(51) Int. Cl.
*G01R 1/04* (2006.01)
*H01L 21/687* (2006.01)
*H01L 21/68* (2006.01)

(52) U.S. Cl.
CPC .......... *G01R 31/2893* (2013.01); *H01L 21/68* (2013.01); *H01L 21/687* (2013.01)

(56) References Cited

U.S. PATENT DOCUMENTS

| | | | | |
|---|---|---|---|---|
| 2006/0175910 A1* | 8/2006 | Asano | ............ | H02K 41/03 310/12.06 |
| 2010/0156434 A1* | 6/2010 | Okino | ............ | G01R 31/2886 324/537 |
| 2010/0213963 A1* | 8/2010 | Yoshikawa | ........ | G01R 31/2896 324/756.03 |

FOREIGN PATENT DOCUMENTS

| | | | |
|---|---|---|---|
| JP | 2009099630 A | * | 5/2009 |
| JP | 2012-063227 A | | 3/2012 |
| JP | 2013-254812 A | | 12/2013 |

\* cited by examiner

WAFER MOUNTING METHOD AND WAFER INSPECTION DEVICE

CROSS REFERENCE TO RELATED APPLICATIONS

This application is a national phase of PCT application No. PCT/JP2013/074003, filed on 30 Aug. 2013, which claims priority from Japanese patent application No. 2012-221256, filed on 3 Oct. 2012, all of which are incorporated herein by reference.

TECHNICAL FIELD

The present invention relates to a wafer mounting method for mounting a wafer to a probe card for wafer inspection.

BACKGROUND

In order to inspect a wafer which is formed with a plurality of semiconductor devices, a prober is used as an inspection device. The prober includes a probe card facing the wafer and the probe card includes a plate-shaped base unit and a plurality of contact probes—columnar contact terminals—disposed on a surface of the base unit which faces the wafer to face electrode pads or soldering bumps of the semiconductor devices of the wafer, respectively (see, e.g., Patent Document 1).

In the prober, each contact probe of the probe card is in contact with an electrode pad or a soldering bump of the semiconductor devices and electricity is caused to flow from each contact probe to an electric circuit of a semiconductor device connected to each electrode pad or each soldering bump so as to inspect a conduction state of the electric circuit.

In order to improve wafer inspection efficiency, a wafer inspection device including a plurality of probe cards has been developed in which while a wafer is conveyed to one probe card by a transport stage, semiconductor devices of the wafer may be inspected by another probe card. In this wafer inspection device, when each wafer is brought into contact with each probe card, air in a space between the probe card and the wafer is evacuated and the wafer is sucked to the probe card by vacuum (see, e.g., Patent Document 2).

However, since rigidity of the wafer is low, the wafer may be bent when only the wafer is sucked to the probe card by vacuum. Thus, each electrode pad or each soldering bump may not be uniformly in contact with each contact probe of the probe card in some cases.

Therefore, as illustrated in FIG. 8A, it has been proposed that a chuck top 80—a thick plate member configured to place a wafer W thereon—be sucked to the probe card 81 by vacuum together with the wafer W so that the chuck top 80 suppresses the wafer W from being bent. In this case, the space between the chuck top 80 and the probe card 81 is surrounded by a bellows 82—a metallic bellows structure—and the air in the space is evacuated (FIG. 8B). The bellows 82, which is compressed when the chuck top 80 approaches the probe card 81, generates a reactive force, so that the position of the chuck top 80 may be deviated from the probe card 81. In addition, even after the wafer W placed on the chuck top 80 is in contact with the probe card 81 (FIG. 8C), the position of the chuck top 80 may be deviated from the probe card 81 when the reactive force of the bellows 82 is large. When the position of the chuck top 80 is deviated from the probe card 81 as described above, each electrode pad or each soldering bump of the wafer W placed on the chuck top 80 may not be in contact with a contact probe of the probe card 81.

In connection with this, the inventors of the present application have proposed preventing occurrence of positional deviation of the chuck 80 from the probe card 81 by providing a guide member 83 protruding toward the chuck top 80 at each side of the probe card 81 so as to guide the chuck top 80, as illustrated in FIGS. 8A to 8C (see, e.g., Patent Document 2).

PRIOR ART DOCUMENT

Patent Documents

Patent Document 1: Japanese Laid-Open Patent Publication No. 2012-063227
Patent Document 2: Specification of Japanese Patent Application No. 2012-128712

SUMMARY OF THE INVENTION

Problems to be Solved

However, since the wafer inspection device is provided with a plurality of probe cards and it is necessary to provide guide members to respectively correspond to the probe card, the structure of the wafer inspection device becomes complicated.

The present invention has been made in an effort to provide a wafer mounting method and a wafer inspection device capable of preventing the structure of the wafer inspection device from becoming complicated.

Means to Solve the Problems

In order to solve the problems described above, the present invention provides a wafer mounting method for mounting a wafer on a probe card having a plurality of contact terminals protruding toward the wafer. The wafer mounding method includes: placing an extendable tubular member which extends toward the wafer to surround the probe card; placing the wafer on a chuck top which is a thick plate member; supporting the chuck top by a movable stage; moving the stage toward the probe card together with the wafer and the chuck top so as to bring the chuck top into contact with the tubular member; even after the chuck top is in contact with the tubular member, moving the stage toward the probe card together with the wafer and the chuck top so as to bring the wafer into contact with the probe card and maintain a positional relationship of the stage, the wafer, and the chuck top; and after the wafer is in contact with the probe card, evacuating a space surrounded by the chuck top, the tubular member, and the probe card.

In the present invention, after the wafer is in contact with the probe card, air in a space surrounded by the chuck top, the tubular member, and the probe card may be evacuated.

In the present invention, when the air in the space is evacuated, a pressing force applied by the chuck top to press the wafer against the probe card may be larger than a reactive force applied to the chuck top by the tubular member.

In the present invention, at least after the chuck top is in contact with the tubular member, the chuck top may be sucked to the stage.

In order to solve the problems described above, the present invention provides a wafer inspection device including: a probe card which includes a plurality of contact terminals protruding toward a wafer; an extendable tubular member placed to surround the probe cards and extend toward the wafer; a chuck top which is a thick plate member configured to place the wafer thereon; and a movable stage configured to support the chuck top thereon. When the air in the space surrounded by the chuck top, the tubular member, and the probe cards is evacuated, a pressing force applied by the chuck top to press the wafer against the probe card is set to be larger than a reactive force applied to the chuck top by the tubular member.

Effect of the Invention

According to the present invention, the stage moves toward the probe card together with the wafer and the chuck top so as to bring the wafer into contact with the probe card, even after the stage moves toward the probe card together with the wafer and the chuck top so as to bring the chuck top into contact with the extendable tubular member which extends toward the wafer. That is, even after the chuck top is in contact with the tubular member, the chuck top is supported by the stage, so that the position of the chuck top is not deviated from the probe card even if the reactive force is applied to the chuck top by the tubular member. Therefore, necessity to provide a guide member that guides the chuck top may be eliminated. As a result, the structure of the wafer inspection device is prevented from becoming complicated.

Further, according to the present invention, when the air in the space surrounded by the chuck top, the tubular member, and the probe card is evacuated after the wafer is brought into contact with the probe card, a pressing force applied by the chuck top to press the wafer against the probe card is larger than a reactive force applied to the chuck top by the tubular member. Thus, the chuck top is not pushed back from the probe card and thus, the position of the chuck top is not deviated from the probe card. As a result, necessity to provide a guide member that guides the chuck top may be eliminated, and the structure of the wafer inspection device may be prevented from becoming complicated.

DETAILED DESCRIPTION TO EXECUTE THE INVENTION

Hereinafter, embodiments of the present invention will be described with reference to the drawings.

First, a wafer inspection device, to which a wafer mounting method according to the embodiment is applied, will be described.

Figure 1:
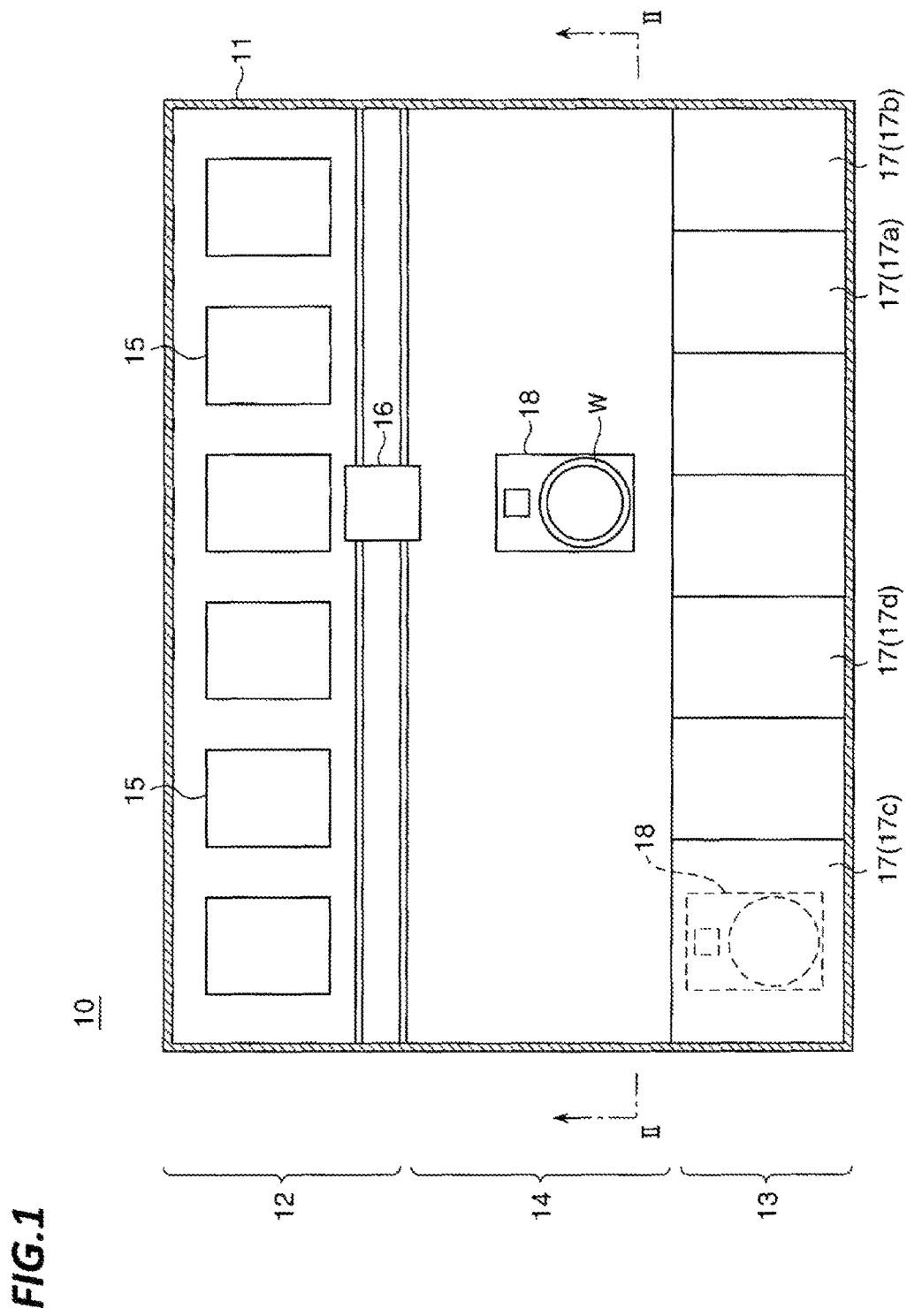
FIG. 1 is a horizontal cross-sectional view schematically illustrating a configuration of a wafer inspection device to which a wafer mounting method according to an embodiment of the present invention is applied.
Figure 2:
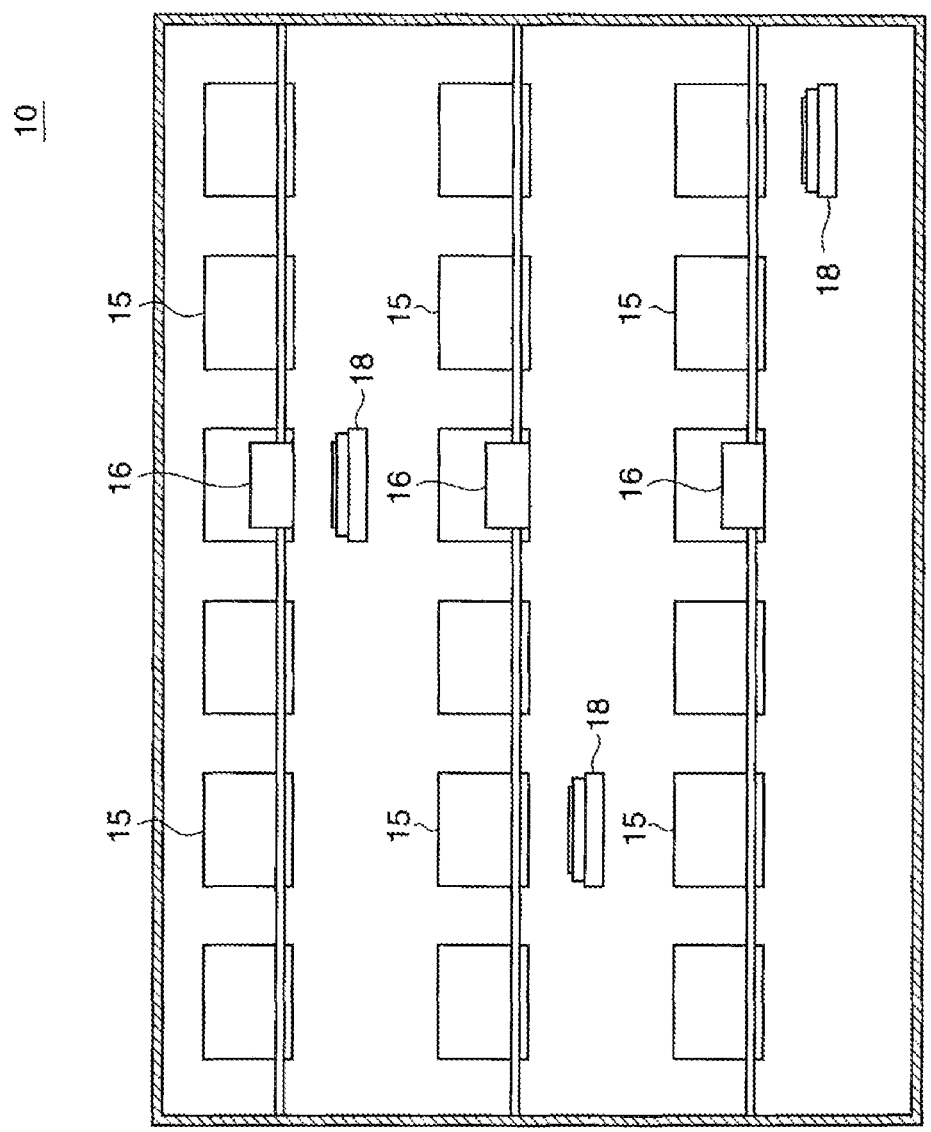
FIG. 2 is a cross-sectional view taken along line II-II of FIG. 1.

FIG. 1 is a horizontal cross-sectional view schematically illustrating a configuration of a wafer inspection device, to which a wafer mounting method according to an embodiment is applied, and FIG. 2 is a cross-sectional view taken along line II-II of FIG. 1.

In FIGS. 1 and 2, a wafer inspection device 10 includes an inspection chamber 11. The inspection chamber 11 includes an inspection area 12, in which an electrical property inspection of each semiconductor device of a wafer W is performed, a carry-in/out area 13, in which carry-in/out of the wafer W in relation to the inspection chamber 11 is performed, and a transport area 14 formed between the inspection area 12 and the carry-in/out area 13.

In the inspection area 12, a plurality of testers 15 serving as wafer inspecting interfaces is placed. Specifically, the inspection area 12 has a three-layer structure of tester rows formed by a plurality of horizontally arranged testers and one tester side camera 16 is disposed to correspond to each tester row. Each tester side camera 16 horizontally moves along a corresponding tester row and is disposed in front of each tester 15 which configures the tester row so as to check a position of a wafer W transported by a transport stage 18 to be described below. The carry-in/out area 13 is divided into a plurality of accommodating spaces 17, and a port 17a configured to receive a FOUP which is a container that accommodates a plurality of wafers, an aligner 17b configured to align the position of the wafer, a loader 17c, in which a probe card 20 is carried into/out of the loader 17c, and a controller 17d configured to control an operation of each component of the wafer inspection device 10 are disposed in the accommodating spaces 17, respectively.

In the transport area 14, a transport stage 18 is disposed to be movable not only to the transport area 14, but also to the inspection area 12 and the carry-in/out area 13. The transport stage 18 collects wafers W from the port 17a of the carry-in/out area 13 so as to transport the wafers W to each tester 15, and transports a wafer W, on which the electrical property inspection of semiconductor devices is completed, from the tester 15 to the port 17a.

In the wafer inspection device 10, each tester 15 inspects the electrical property of each semiconductor device of the transported wafer W. While the transport stage 18 transports the wafer W toward one tester 15, another tester 15 inspects the electrical property of each semiconductor device of another wafer W. Thus, wafer inspection efficiency may be improved.

Figure 3:
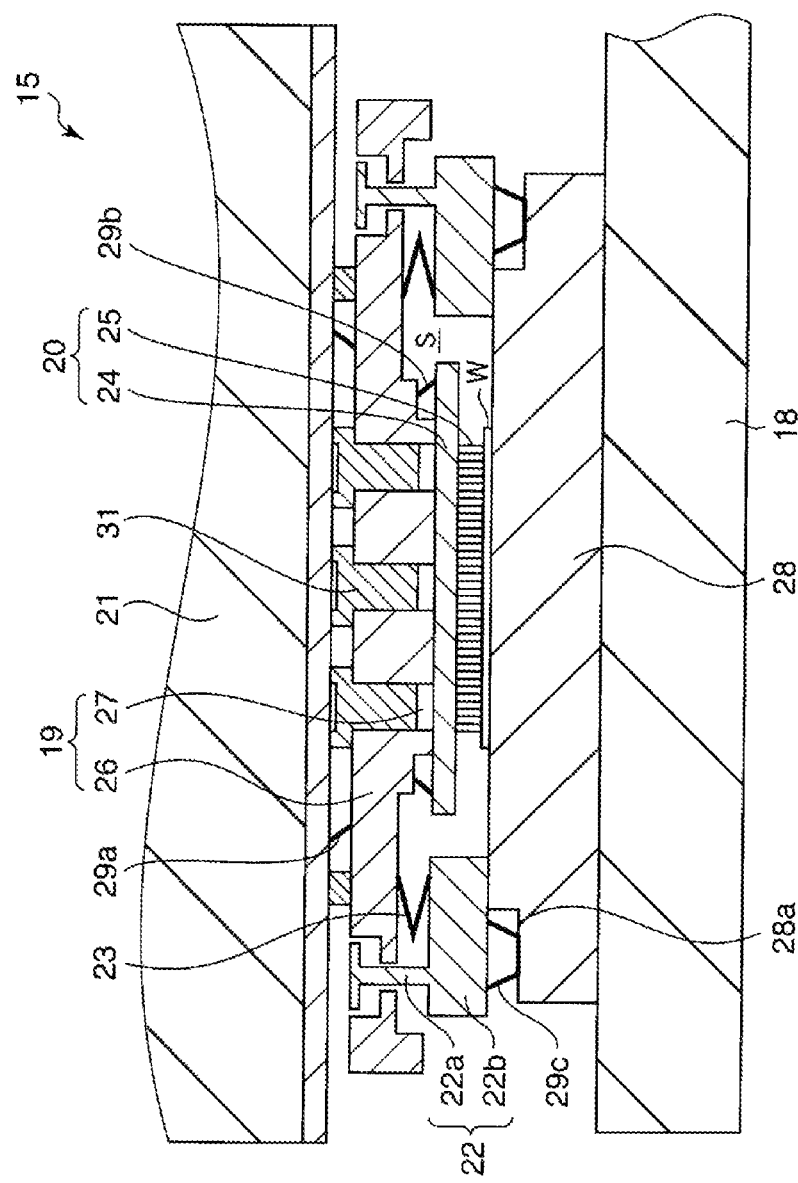
FIG. 3 is a cross-sectional view schematically illustrating a configuration of a transport stage and a tester in FIGS. 1 and 2.

FIG. 3 is a cross-sectional view schematically illustrating a configuration of a transport stage and a tester in FIGS. 1 and 2. Meanwhile, FIG. 3 illustrates a state where the transport stage 18 brings a wafer W into contact with a probe card 20 of the tester 15.

In FIG. 3, the tester 15 includes a probe card 20, a pogo frame 19, in which the probe card 20 is mounted on a bottom of the pogo frame 19, a base 21 configured to support the pogo frame 19, a flange 22 (a tubular member) coupled to the pogo frame 19 and configured to be vertically movable with respect to the pogo frame 19, and a bellows 23 (a tubular member) interposed between the pogo frame 19 and the flange 22.

The probe card 20 includes a disc-shaped main body 24, a plurality of electrodes (not illustrated) placed on substantially one surface of the top surface of the main body 24, and a plurality of contact probes 25 placed to protrude from the bottom surface of the main body 24 downwardly in the drawing. When each electrode is connected to each contact probe 25 corresponding thereto and the wafer W is in contact with the probe card 20, each contact probe 25 is in contact with an electrode pad or a soldering bump of each semiconductor device formed on the wafer W.

The pogo frame 19 includes a substantially flat main body 26 and a plurality of pogo block insertion holes 27 which is through holes formed in the vicinity of the center of the main body 26, and a pogo block 31 in which a plurality of pogo pins is arranged is inserted into each of the pogo block insertion holes 27. The pogo block 31 is connected to an inspection circuit (not illustrated) provided on the tester 15 and is in contact with a plurality of electrodes on the top surface of the main body 24 in the probe card 20 mounted in the pogo frame 19 so as to cause an electric current to flow to each contact probe 25 of the probe card 20 connected to the electrodes and to cause the electric current, which flows through each contact probe 25 from the electric circuit of each semiconductor device of the wafer W, to flow toward the inspection circuit.

The flange 22 includes a cylindrical main body 22a and a contact portion 22b configured by a circular ring shaped member formed below the main body 22a, and is disposed to surround the probe card 20. As will be described below, until the chuck top 28 comes into contact with the flange 22, the flange 22 moves such that the bottom surface of the contact unit 22b is positioned below a tip end of each contact probe 25 of the probe card 20 by its own weight.

The bellows 23 is a metallic bellows structure and is configured to be extendible in the vertical direction. A lower end and an upper end of the bellows 23 are closely attached to the top surface of the contact unit 22b of the flange 22 and the bottom surface of the pogo frame 19, respectively.

In the tester 15, a space between the pogo frame 19 and the base 21 is sealed by a sealing member 29a and evacuated so that the pogo frame 19 is mounted on the base 21, and a space between the pogo frame 19 and the probe card 20 is sealed by a sealing member 29b and evacuated so that the probe card 20 is mounted on the pogo frame 19.

The transport stage 18 is formed as a flat member placed below the tester 15. The transport stage 18 supports a pedestal-shaped chuck top 28 and a wafer W is placed on the top surface of the chuck top 28. The chuck top 28 is sucked to the transport stage 18 by vacuum and the wafer W is sucked to the chuck top 28 by vacuum. Accordingly, the chuck top 28 or the wafer W is prevented from being moved relatively with respect to the transport stage 18 when the transport stage 18 moves. Meanwhile, the method of holding the chuck top 28 or the wafer W is not limited to the suction by vacuum as long as the relative movement with respect to the chuck top 28 or the transport stage 18 of the wafer W may be prevented. For example, the chuck top 28 and the wafer W may be held by electromagnetic attraction or by a clamp.

A step 28a is formed on a circumferential edge portion of the top surface of the chuck top 28 and a sealing member 29c is placed in the step 28a.

Since the transport stage 18 is movable, the transport stage 18 moves to a lower portion of the probe card 20 of the tester 15 so as to allow the wafer W placed on the chuck top 28 to face the probe card 20, and moves toward the tester 15 so as to bring the wafer W into contact with the probe card 20.

In the present embodiment, the pogo frame 19, the probe card 20, and the flange 22 of the tester 15, and the chuck top 28 or the wafer W placed on the transport stage 18 are horizontally disposed. Thus, when the transport stage 18 moves toward the tester 15, the chuck top 28 comes into contact with the contact unit 22b of the flange 22 without a gap therebetween, and the wafer W comes into contact with the plurality of contact probes 25 without a clearance.

A space S, which is formed when the chuck top 28 is in contact with the contact unit 22b of the flange 22 and the wafer W is in contact with the probe card 20 and surrounded by the chuck top 28, the flange 22, the pogo frame 19, and the probe card 20, is sealed by the bellows 23 and the sealing member 29c, and air in the space S is evacuated so that the chuck top 28 upwardly presses the wafer W so as to bring each contact probe 25 of the probe card 20 into contact with an electrode pad or a soldering bump in each semiconductor device of the wafer W.

In the wafer inspection device 10, the movement of the transport stage 18 is controlled by the controller 17d, and the controller 17d checks the position or the movement amount of the transport stage 18.

Next, a wafer mounting method according to the present embodiment will be described. The wafer mounting method according to the present embodiment is individually performed on the probe card 20 of each of the testers 15.

FIGS. 4A to 4D are process charts of the wafer mounting method according to the present embodiment.

Figure 4A:
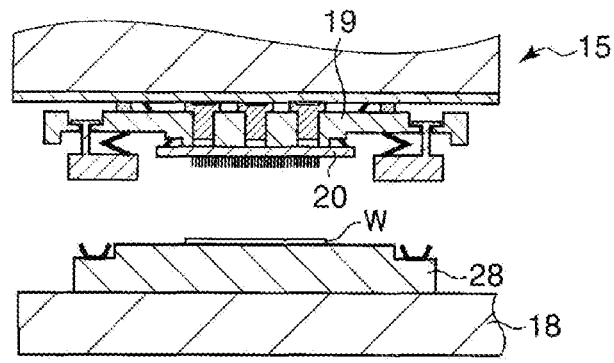
FIGS. 4A to 4D are process charts of a wafer mounting method according to the embodiment.

First, the chuck top 28 is supported by the transport stage 18 and sucked to the transport stage 18 by vacuum, a wafer W is placed on the chuck top 28 and sucked to the chuck top 28 by vacuum, and then the transport stage 18 moves to a position below one of the testers 15 together with the wafer W and the chuck top 28 so that the center of the wafer W faces the center of the probe card 20 mounted on the pogo frame 19 of the tester 15 (FIG. 4A).

Figure 4B:
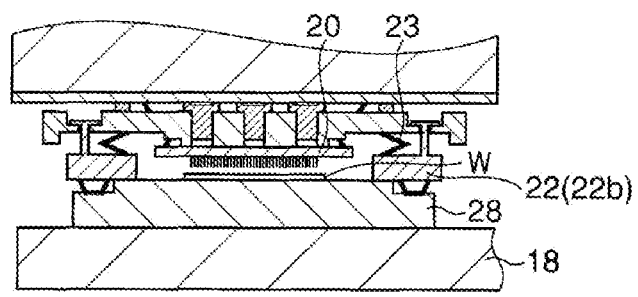

Next, the transport stage 18 moves upwardly toward the probe card 20 together with the wafer W and the chuck top 28 so as to bring the chuck top 28 into contact with the contact unit 22b of the flange 22 (FIG. 4B). In this case, since the bellows 23 is interposed between the flange 22 and the pogo frame 19, the chuck top 28 is in indirect contact with the bellows 23 via the flange 22.

Figure 4C:
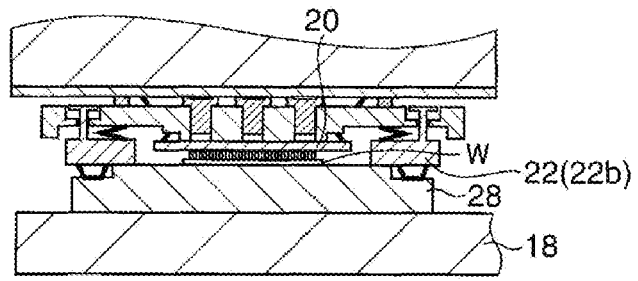

Next, even after the chuck top 28 is in contact with the contact unit 22b, the transport stage 18 upwardly moves toward the probe card 20 together with the wafer W and the chuck top 28 so as to bring the wafer W into contact with the probe card 20 (FIG. 4C).

Next, the air in the space S surrounded by the chuck top 28, the flange 22, the pogo frame 19, and the probe card 20 is evacuated so as to suck the chuck top 28 to the probe card 20 by vacuum, thereby maintaining a positional relationship of the chuck top 28 and the probe card 20. In this case, the bellows 23 is compressed to apply a reactive force to the chuck top 28, and a reduced pressure value in evacuation is set such that the pressing force applied to the wafer W by the chuck top 28 due to the evacuation of the air in the space S becomes larger than the reactive force applied to the chuck top 28.

Figure 4D:
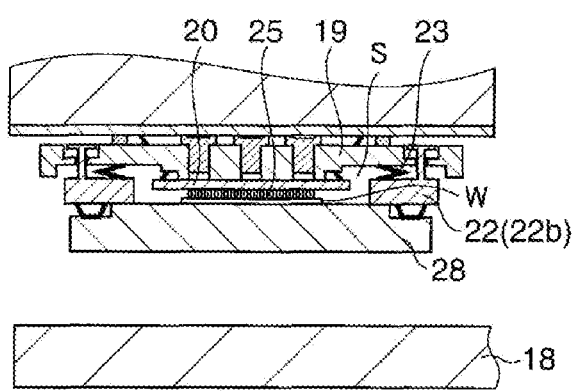

Next, while maintaining the evacuation of the air in the space S, the transport stage 18 stops the evacuation of the chuck top 28 to be spaced apart from the chuck top 28 (FIG. 4D). In this case, the chuck top 28 serves as an outer wall that defines the space S, but the wafer W does not serve as an outer wall that defines the space S. As a result, a negative pressure caused by the evacuation of the air in the space S is not applied to the wafer W, so that the wafer W is not bent.

Next, after the transport stage 18 moves to a position below the tester 15, the method is terminated.

According to the wafer mounting method of the present embodiment, even after the transport stage 18 moves toward the probe card 20 together with the wafer W and the chuck top 28 so as to bring the chuck top 28 into indirect contact with the bellows 23, the transport stage 18 further moves toward the probe card 20 together with the wafer W and the chuck top 28 so as to bring the wafer W into contact with the probe card 20. That is, even after the chuck top 28 is in indirect contact with the bellows 23, the chuck top 28 is supported by the transport stage 18 until the wafer W comes into contact with the probe card 20. Therefore, even if the reactive force is applied from the bellows 23 to the chuck top 28, the position of the chuck top 28 is not deviated from the probe card 20.

Further, in the wafer mounting method of the present embodiment, when the air in the space S surrounded by the chuck top 28, the flange 22, the pogo frame 19, and the probe card 20 is evacuated after the wafer W is brought into contact with the probe card 20, the pressing force applied to the wafer W by the chuck top 28 is larger than the reactive force applied to the chuck top 28 by the bellows 23. Thus, the chuck top 28 is not pushed back from the probe card 20 and thus, the position of the chuck top 28 is not deviated from the probe card 20.

That is, the position of the chuck top 28 is not deviated from the probe card 20 after the chuck top 28 is in indirect contact with the bellows 23. Thus, necessity to provide a guide member that guides the chuck top 28 may be eliminated and the structure of the wafer inspection device 10 may be prevented from being complicated.

In the wafer mounting method of the present embodiment described above, the chuck top 28 is sucked to the transport stage 18 by vacuum before the chuck top 28 is in indirect contact with the bellows 23. However, the chuck top 28 may be sucked to the transport stage 18 by vacuum immediately after the chuck top 28 is in indirect contact with the bellows 23. Even in this case, when the chuck top 28 receives the reactive force from the bellows 23, the chuck top 28 is sucked to the transport stage 18 by vacuum. Thus, the position of the chuck top 28 may be surely prevented from being deviated from the transport stage 18.

FIGS. 5A to 5C and 6A to 6C are process charts of a modified embodiment of the wafer mounting method according to the embodiment. In this modified embodiment, the number of contact probes 25 of the probe card 20 is smaller than the number of electrode pads or soldering bumps in each semiconductor device of a wafer W. This modified embodiment is applied when it is required to bring a contact probe 25, which has been already in contact with one electrode pad or one soldering bump, into contact with another electrode pad or soldering bump by changing the position of the wafer W with respect to the probe card 20 in order to inspect all semiconductor devices formed on the wafer W.

Meanwhile, the modified embodiment will be described in a state when the wafer mounting method illustrated in FIGS. 4A to 4D has been performed already so that the wafer W or the chuck top 28 is mounted on the tester 15.

Figure 5A:
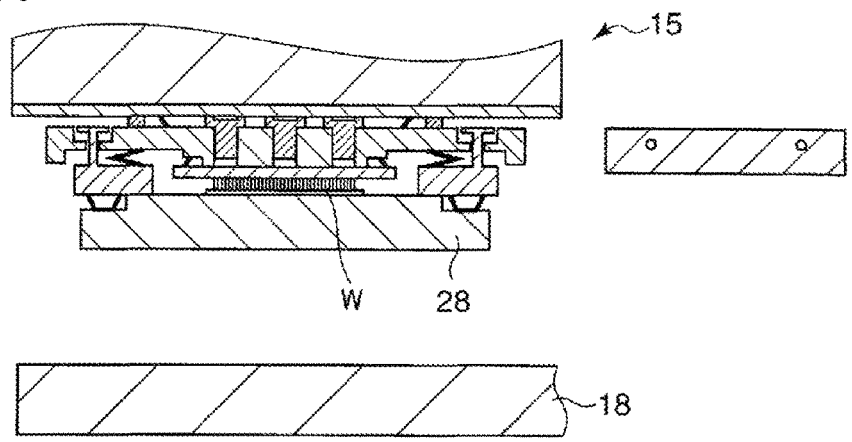
FIGS. 5A to 5C are process charts of a modified example of the wafer mounting method according to the embodiment.

First, only the transport stage 18 moves to a position below the tester 15 to face the chuck top 28 mounted on the tester 15 (FIG. 5A). In this case, each contact probe 25 of the probe card 20 is in contact with one electrode pad or one soldering bump in each semiconductor device of the wafer W.

Figure 5B:
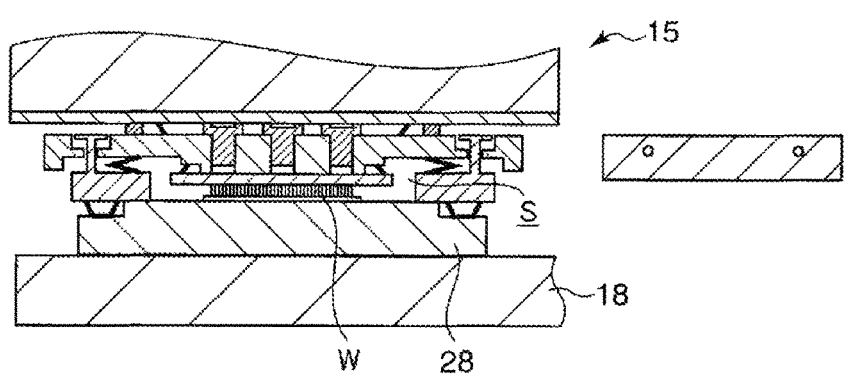

Next, the transport stage 18 moves upwardly toward the tester 15 to bring the transport stage 18 into contact with the chuck top 28 and then evacuation of the air in the space S is stopped so as to raise the pressure in the space S. In this case, since the chuck top 28 is not sucked upwardly, the chuck top 28 is spaced apart from the flange 22 and supported by the transport stage 18 (FIG. 5B).

Figure 5C:
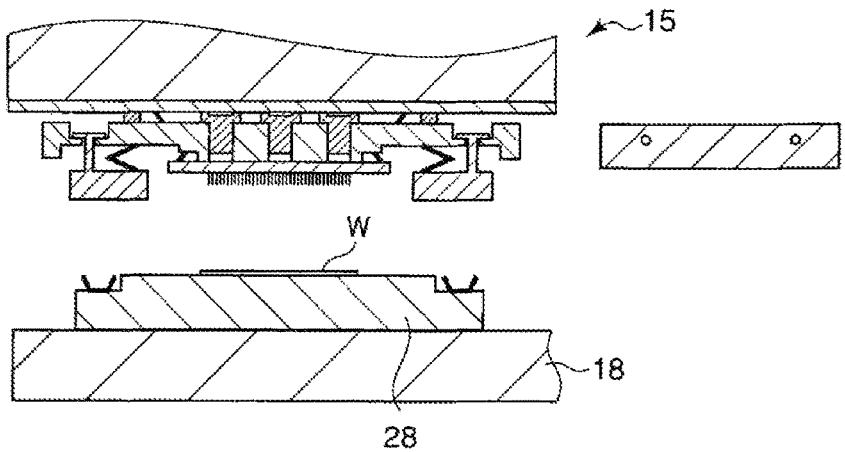

Next, the transport stage 18 moves to a position below the tester 15 together with the chuck top 28 or the wafer W (FIG. 5C).

Figure 6A:
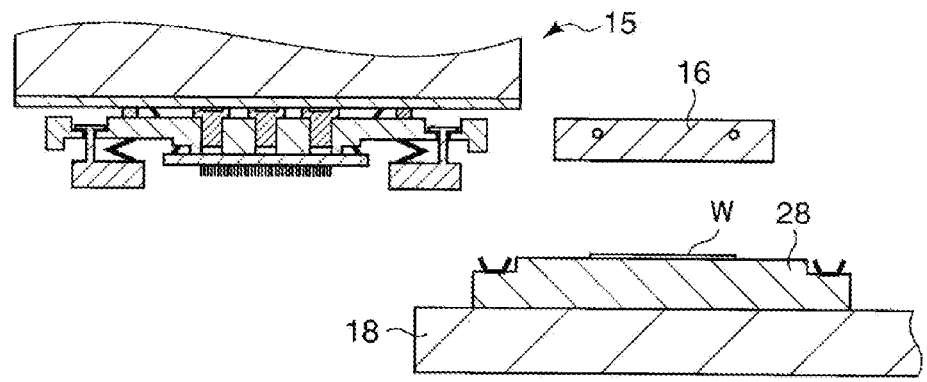
FIGS. 6A to 6C are process charts of a modified example of the wafer mounting method according to the embodiment.

Next, the transport stage 18 moves such that the wafer W faces a tester side camera 16 and the position of the center of the wafer W is checked by the tester side camera 16 (FIG. 6A). In this case, the controller 17d determines the movement amount of the transport stage 18 based on the checked position of the center of the wafer W or a distance from one electrode pad to another electrode pad (or from one soldering bump to another soldering bump). Next, the wafer W is sucked by vacuum by the chuck top 28 and the chuck top 28 is sucked by vacuum by the transport stage 18 such that the wafer W or the chuck top 28 is not relatively deviated from the transport stage 18 in a subsequent process.

Figure 6B:
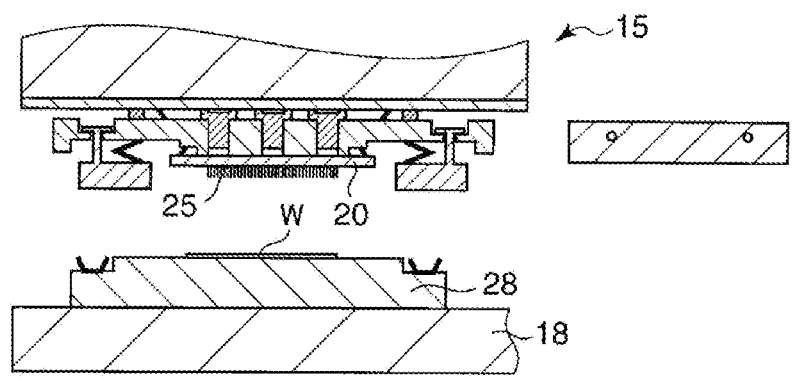

Next, the transport stage 18 moves according to the determined movement amount together with the wafer W or the chuck top 28 to face the tester 15 again (FIG. 6B). In this case, another electrode pad or another soldering bump in each semiconductor device of the wafer W face to each contact probe 25 of the probe card 20.

Figure 6C:
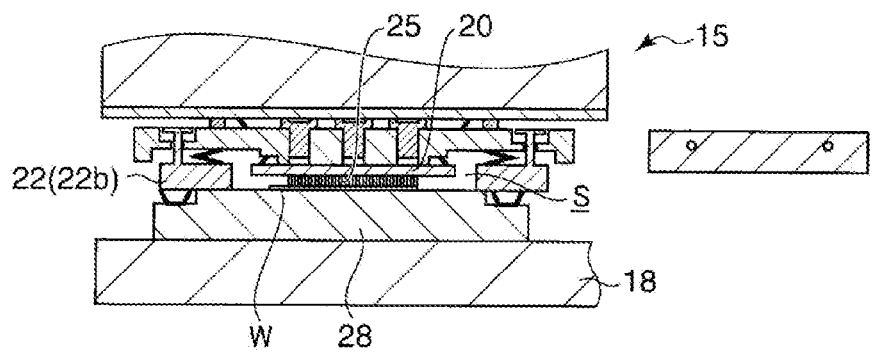

Next, even after the transport stage 18 moves toward the tester 15 and the chuck top 28 is in contact with the contact unit 22b of the flange 22, similarly to the process of FIG. 4C, the transport stage 19 continuously moves so as to bring the wafer W into contact with the probe card 20 and further the air in the space S is evacuated so as to suck the chuck top 28 upwardly, so that another electrode pad or another soldering bump in each semiconductor device of the wafer W is in contact with each of the contact probes 25 of the probe card 20 (FIG. 6C). That is, also in this modified embodiment, even after the chuck top 28 is in indirect contact with the bellows 23, the chuck top 28 is supported by the transport stage 18 until the wafer W is in contact with the probe card 20.

According to the modified embodiment, after another electrode pad or soldering bump in each semiconductor device of the wafer W faces each contact probe 25 of the probe card 20, the chuck top 28 is supported by the transport stage 18 until the wafer W is in contact with the probe card 20. Therefore, even if the reactive force is applied from the bellows 23 to the chuck top 28, a position of the chuck top 28 and hence the wafer W is not deviated from the probe card 20. That is, since each contact probe 25 which is in contact with one electrode pad or one soldering bump is in contact with another electrode pad or another soldering bump, deviation of the wafer W from the probe card 20 due to the reactive force from the bellows 23 is not caused when the position of the wafer W is moved to the probe card 20 by the transport stage 18. Therefore, each contact probe 25 may be precisely in contact with another electrode pad or soldering bump.

In the modified embodiment described above, the position of the center of the wafer W is checked by the tester side camera 16 after the wafer W or the chuck top 28 is removed from the tester 15. However, since the chuck top 28 is sucked by vacuum by the transport stage 18 and the wafer W is sucked by vacuum by the chuck top 28 after the transport stage 18 is brought into contact with the chuck top 28 in FIG. 5B, the wafer W or the chuck top 28 is not relatively deviated from the transport stage 18 thereafter. Accordingly, necessity to check the position of the center of the wafer W may be eliminated and the controller 17d may determine the movement amount of the transport stage 18 only based on the distance from one electrode pad to another electrode pad (or from one soldering bump to another soldering bump). In this case, since the process of FIG. 6A described above may be omitted, the wafer W inspection time may be shortened.

The present invention has been described above with reference to embodiments as described above, but the present invention is not limited to the embodiments described above.

Figure 7:
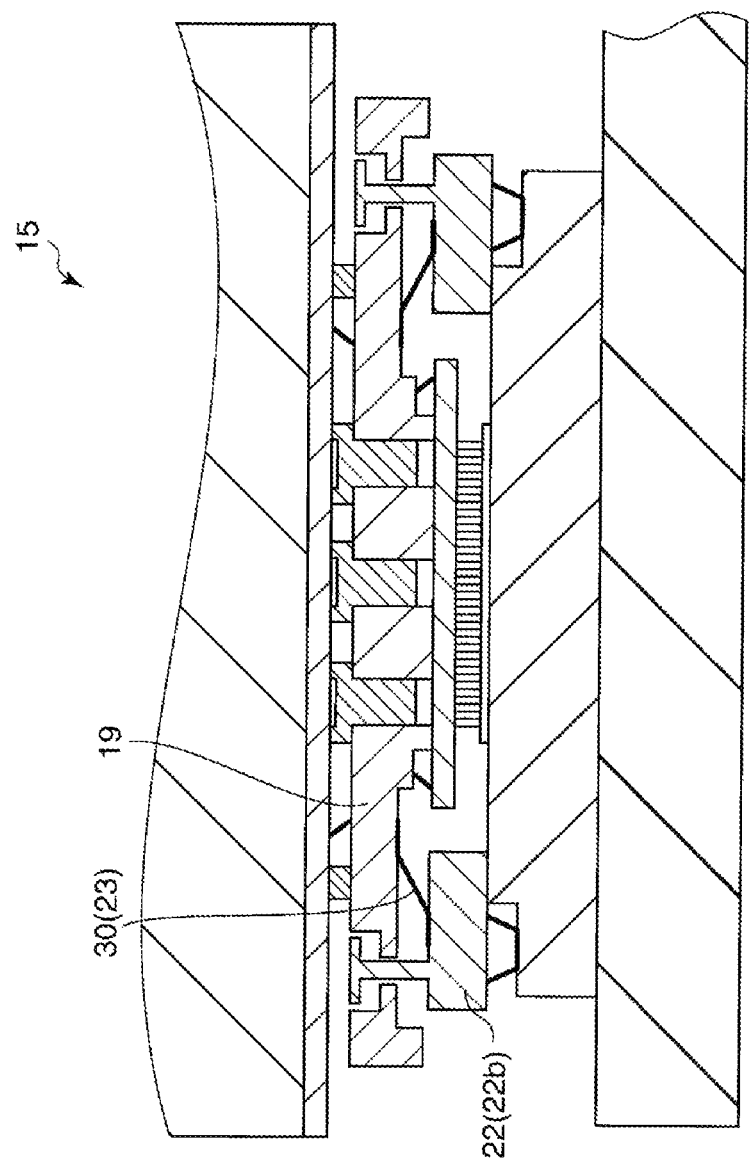
FIG. 7 is a cross-sectional view schematically illustrating a configuration of a transport stage and a tester in a modified example of a wafer inspection device according to an embodiment of the present invention.
Figure 8A:
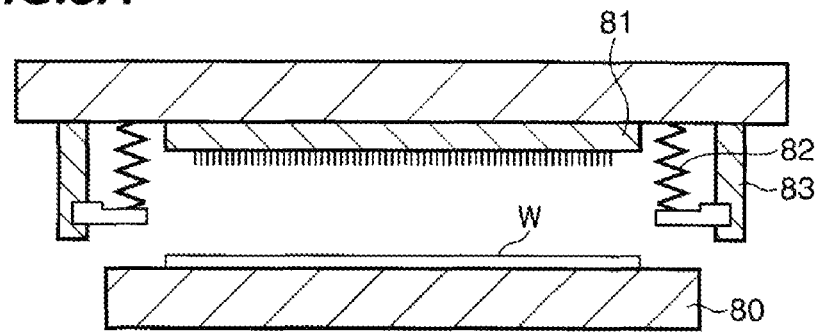
FIGS. 8A to 8C are process charts of a wafer mounting method which is performed in a wafer inspection device of the related art.
Figure 8B:
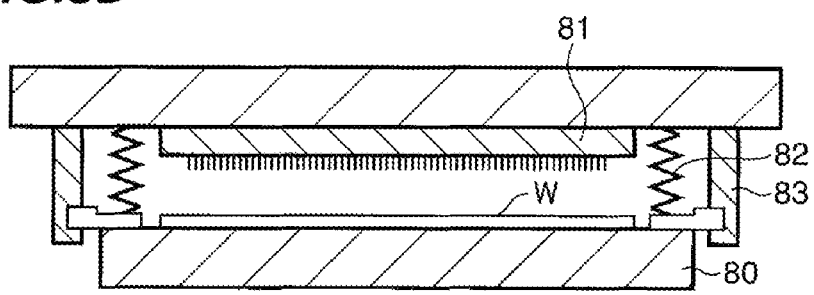
Figure 8C:
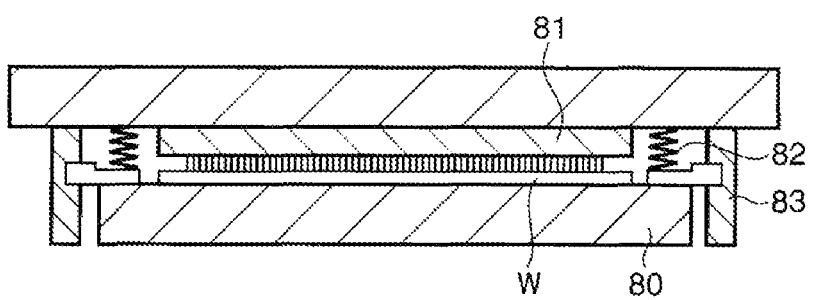

For example, although the bellows 23 is configured by a metallic bellows structure in the embodiments described above, the bellows 23 may be configured by a member capable of being in close contact with the pogo frame 19 or the flange 22 and following the movement of the flange 22. For example, as illustrated in FIG. 7, the bellows 23 may be configured by a ring-shaped sealing member 30 formed of a non-metallic material, for example, a silicon rubber or a resin.

Further, although the wafer mounting method in the embodiments described above are applied to the wafer inspection device 10 which includes a plurality of testers 15, the wafer mounting method may also be applied to a prober of the related art which includes only one tester.

An object of the present invention may also be achieved by providing a storage medium that stores program codes of software to implement the functions of the above-described embodiment, to a computer (for example, the controller 17d) provided in the wafer inspection device 10, and reading out and executing the program codes stored in the storage medium by a CPU of the computer.

In this case, the program codes read out from the storage medium implement the functions of the embodiment described above, and the program codes and the storage medium that stores the program codes configure the present invention.

Further, as the storage medium that provides the program codes, any medium may be used as long as it may store the program codes. For example, a RAM, an NV-RAM, a floppy (registered trademark) disc, a hard disc, a magneto optic disc, an optical disc such as, for example, a CD-ROM, a CD-R, a CD-RW, and DVD (DVD-ROM, DVD-RAM, DVD-RW, DVD+RW), a magnetic tape, a non-volatile memory card, or any other ROM may be used. Alternatively, the program codes may be downloaded from, for example, another computer or a database (not illustrated) which is connected to, for example, the Internet, a commercial network, or a local area network to be supplied to the computer.

Alternatively, the functions of the embodiment may be implemented not only by executing the program codes read out by the computer, but also by an actual processing which is partially or entirely performed by an operating system (OS) running on the CPU, based on an instruction of the program codes.

Furthermore, after the program codes read out from the storage medium are stored in a memory provided in a function extension board inserted into the computer or a function extension unit connected to the computer, the functions of the above-described embodiments may also be implemented by an actual processing which is partially or entirely performed by the CPU provided in the function extension board or the function extension unit, based on the instruction of the program codes.

The program codes may be configured in a form of, for example, object codes, program codes executed by an interpreter, or script data supplied to the OS.

The present application claims the benefit of priority Japanese Patent Application No. 2012-221256 filed on Oct. 3, 2012, the entire contents of which are incorporated herein by reference.

DESCRIPTION OF SYMBOLS

W: Wafer
10: Wafer inspection device
18: Transport stage
20: Probe card
22: Flange
23: Bellows
25: Contact probe
28: Chuck top

What is claimed is:

1. A wafer mounting method for mounting a wafer on a probe card having a plurality of contact terminals protruding toward the wafer, the wafer mounting method comprising:
   placing an extendable tubular member which extends toward the wafer to surround the probe card;
   placing the wafer on a chuck top which is a thick plate member;
   supporting the chuck top by a movable stage moving between a plurality of testers arranged horizontally and each including the probe card and the tubular member;
   moving the stage toward the probe card together with the wafer and the chuck top so as to bring the chuck top into contact with the tubular member;
   after the chuck top is in contact with the tubular member, moving the stage toward the probe card together with the wafer and the chuck top so as to bring the wafer into contact with the probe card and maintain a positional relationship of the stage, the wafer, and the chuck top without evacuating air in a space surrounded by the chuck top, the tubular member, and the probe card;
   after the wafer is in contact with the probe card, evacuating the air in the space surrounded by the chuck top, the tubular member, and the probe card; and
   maintaining the stage apart from the chuck top while the wafer is being inspected.

2. The wafer mounting method of claim 1, wherein, when the air in the space is evacuated, a pressing force applied by the chuck top to press the wafer against the probe card is larger than a reactive force applied to the chuck top by the tubular member.

3. The wafer mounting method of claim 1, wherein, at least after the chuck top is in contact with the tubular member, the chuck top is sucked to the stage.

4. A wafer inspection device comprising:
   a plurality of testers arranged horizontally and each including a probe card which includes a plurality of contact terminals protruding toward the wafer and an extendable tubular member placed to surround the probe card and extend toward the wafer;
   a chuck top which is a thick plate member configured to place the wafer thereon;
   a movable stage configured to support the chuck top thereon and move between the plurality of testers; and
   a controller programmed to control an overall operation of the wafer inspection device,
   wherein the controller is programmed to move the stage toward the probe card together with the wafer and the chuck top so as to bring the stage into contact with the tubular member, after the chuck top is in contact with the tubular member, move the stage toward the probe card together with the wafer and the chuck top so as to bring the wafer into contact with the probe card and maintain a positional relationship of the stage, the wafer, and the chuck top without evacuating air in a space surrounded by the chuck top, the tubular member, and the probe card, when the air in the space surrounded by the chuck top, the tubular member, and the probe cards is evacuated after the wafer is in contact with the probe card, apply a pressing force by the chuck top to press the wafer against the probe card such that the pressing force is set to be larger than a reactive force applied to the chuck top by the tubular member, and maintain the stage to be spaced apart from the chuck top while the wafer is being inspected.

5. The wafer inspection device of claim 4, wherein the chuck top is sucked to the stage by vacuum and the wafer is sucked to the chuck top by vacuum.

6. The wafer inspection device of claim 4, wherein the wafer inspection device further includes a tester side camera configured to move horizontally along the plurality of testers and is disposed in front of each of the plurality of testers so as to check a position of the wafer transported by the stage.

7. The wafer inspection device of claim 4, wherein the controller of the wafer inspection device is further programmed to determine a movement amount of the stage based on a distance from one electrode pad to another electrode pad.

* * * * *